United States Patent [19]
Jung et al.

[11] Patent Number: 5,660,318
[45] Date of Patent: Aug. 26, 1997

[54] APPARATUS FOR INNER LEAD BONDING (ILB) COMPRISING A HEAT DISSIPATION PIN AND METHOD OF ILB USING SUCH AN APPARATUS

[75] Inventors: Il Gyu Jung, Anyang; Tae Gyeong Chung, Suwon; Tae Koo Lee, Seongnam, all of Rep. of Korea

[73] Assignee: Samsung Electronics Co., Ltd., Suwon, Rep. of Korea

[21] Appl. No.: 509,232

[22] Filed: Jul. 31, 1995

[30] Foreign Application Priority Data

Apr. 24, 1995 [KR] Rep. of Korea .............. 95-9659

[51] Int. Cl.⁶ ..................................... H01L 21/58
[52] U.S. Cl. ............... 228/102; 228/6.2; 228/180.22; 228/222
[58] Field of Search ................. 228/180.21, 180.22, 228/6.2, 222, 102

[56] References Cited

U.S. PATENT DOCUMENTS 4,051,508  9/1977  Sato et al. .
4,060,828  11/1977  Satonaka .
4,244,002  1/1981  Sato et al. .
5,120,391  6/1992  Ishida ............................... 228/6.2 X

FOREIGN PATENT DOCUMENTS 15433  1/1988  Japan .

OTHER PUBLICATIONS

Lau, et al: "Overview of Tape Automated Bonding Technology", Electronic Materials Handbook vol. 1, Packaging, pp. 275, 277, 281 & 288.

Primary Examiner—Kenneth J. Ramsey
Attorney, Agent, or Firm—Cushman Darby & Cushman Intellectual Property Group of Pillsbury Madison & Sutro LLP

[57] ABSTRACT

An inner lead bonding apparatus having a heat dissipation plate attached to inner leads and to a support for upholding a lead frame of a tape automated bonding package. The heat dissipation plate is, during performance of an inner lead bonding process, located near the bonding interface of bumps formed on a semiconductor chip or on the inner leads and the inner leads, and includes a fastener for fixing itself to the support and elliptical bolt holes for enabling its contact position to the inner leads to be controllable.

12 Claims, 4 Drawing Sheets

APPARATUS FOR INNER LEAD BONDING (ILB) COMPRISING A HEAT DISSIPATION PIN AND METHOD OF ILB USING SUCH AN APPARATUS

BACKGROUND OF THE INVENTION

1. Technical Field

This invention relates generally to a semiconductor package, and more particularly to an inner lead bonding apparatus comprising a heat dissipation means for preventing heat from being transferred to the tape automated bonding tape during inner lead bonding process, and to a method for inner lead bonding using such an inner lead bonding apparatus.

2. Description of the Prior Art

Tape automated bonding thereinafter "TAB" which was introduced by General Electric Co. in 1960's is one of automated technologies for packaging a plurality of semiconductor devices in place of wire bonding technology. As TAB technology develops and the reliability of TAB increases, the application of TAB packages are gradually broadened to the fields requiring more stable and more excellent electrical properties such as Very High Speed ICs, Liquid Crystal Displays, Super Computers or and the like.

TAB process begins with the step of bonding, by using a thermo-compression bonding technique, a silicon chip to a patterned metal, for example, a copper pattern formed on a polymer tape (e.g., polyimide tape). Generally the tape used in TAB comprises an adhesive layer made of various adhesive materials including polyimides, epoxies, acrylics and phenolic-butyrals. The choice of an adhesive should be made based, with first priority, on its thermal stability, because a TAB package will be challenged during elevated temperature processes such as Inner Lead Bonding (hereinafter, referred to as 'ILB'), encapsulation-curing, burn-in testing and outer lead bonding. In particular, an ILB process in which patterned inner leads are bonded to bumps formed on bonding pads of the semiconductor chips is carried out under a condition of 530°–550° C. in order to increase the pull strength of the junction interface between inner leads and the bumps. The ILB process is typically accomplished by either a single point bonding method or a gang bonding method. The gang bonding, method which is disclosed in U.S. Pat. No. 3,763,404 and U.S. Pat. No. 4,051,508, is widely used in mass production of TAB packages in a short processing cycle since TAB beam leads can be bonded simultaneously by methods including thermo-compression bonding, dynamic alloy formation, solder reflow, and the like.

FIG. 1 shows a prior art TAB package during ILB process is running. Referring to this Figure, inner leads 1 formed in a predetermined pattern by, for example, photolithography is attached by an adhesive 2 to a polymer (e.g., polyimide) layer 3 to form a three-layered tape. On the chip bonding pads 7 of a semiconductor device 8 are formed bumps 6 for electrical interconnection with the inner leads 1. In ILB, a plurality of semiconductor chips 8 are automatically pre-aligned by an xy-coordinate table (not shown) with reference to a bonding machine 5 such as a thermode. A supporting means or clamp 4 is used to fasten a lead frame of TAB, and the position of the former is preset, optimized so as to secure a stable fixation of the TAB leads. During the ILB process, a chip carrier (not shown) rises to the bond level, and the bonding machine 5 drops to apply heat and pressure through metallic leads 1 on the tape to the bumps 6 on the chip 8. At this time, the heat conducted to the adhesive 2 of the lead frame from the bonding machine 5 is likely cause a so called degradation phenomenon in which the thermally fragile adhesive is melted down. Even if this does not occur, high stress is inevitably put on the interface of the adhesive, which and the leads, because the adhesive expanded during ILB process contracts after ILB is finished. This kind of stress can be also applied to the junction point between the inner leads 1 and the bumps 6 because of the difference in their thermal expansion coefficients. This will result in breaking-off the ILB junction interface which will, in turn, cause critical electrical failures of the device.

The dwell time taken by the thermode 5 in thermo-compressing the leads just lying on the bumps, and the temperature of the thermode 5 have a very important influence upon the bonding strength of the ILB junction interface. This strength will be apparently increased in proportion to the temperature and the dwell time. However, the problems of stress, breaking-off of the interface and the melting down of the adhesive as described above will be likewise made more severe. Accordingly, a compromise of the two factors must be made.

SUMMARY OF THE INVENTION

Accordingly, it is an object of this invention to provide an inner lead bonding apparatus which can overcome the disadvantages caused by the thermal problems, and to provide a method for inner lead bonding using such an apparatus. It is another object of this invention to eliminate the limits of the temperature of the bonding machine and the dwell time, as well as to prevent degradation occurring near the adhesive, and to obtain high bonding performance of the inner leads to the bumps.

According to one aspect of the present invention, an apparatus for bonding bumps formed on bonding pads of a semiconductor chip to inner leads of patterned metal formed on a polymer tape by, for example, photo-lithography technology comprises a thermo-compressing means for providing heat and pressure to the bumps and an area of the each inner lead which will be directly bonded to the upper surfaces of the bumps, a supporting means for upholding the inner leads, and a heat dissipation means attached to the supporting means and to the inner leads near the area directly bonded to the bumps.

According to another aspect of the present invention, the heat dissipation means is coupled to the supporting means by screws and bolt holes, wherein the bolt holes are formed in the heat dissipation means and the transverse dimension of each of bolt hole is longer at one direction so that the position of the heat dissipation means can be adjusted to accommodate several kinds of differently sized TAB packages.

DETAILED DESCRIPTION OF PREFERRED EMBODIMENTS

Figure 1:
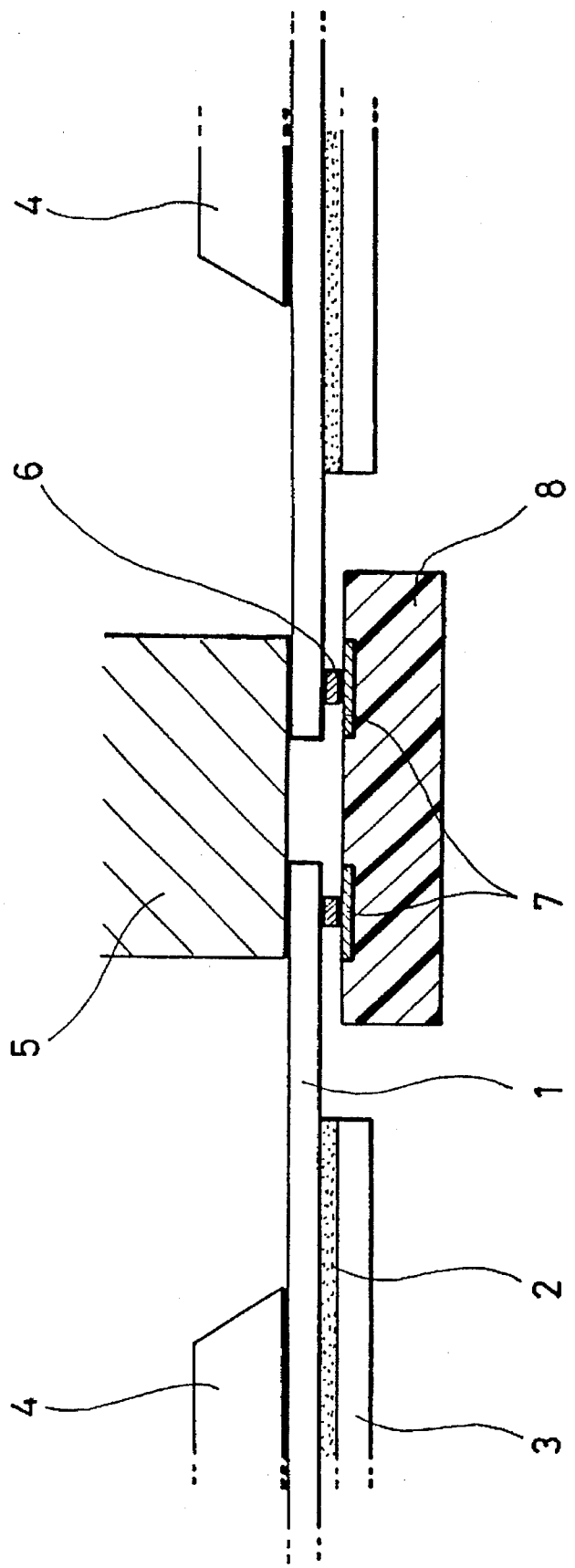
FIG. 1 is a partial cross-sectional view of the a TAB package which is subjected to an ILB process by using a conventional bonding machine.
Figure 2A:
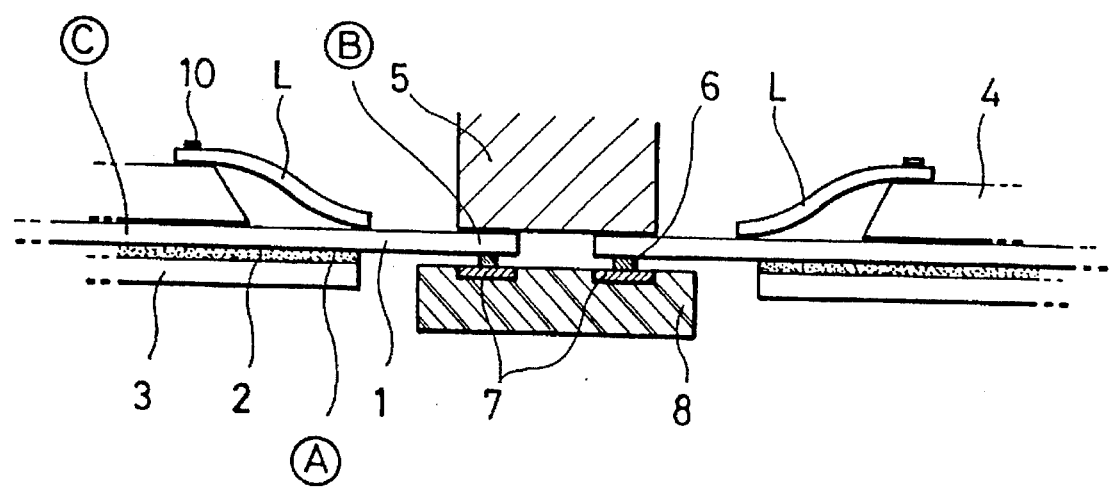
FIG. 2A is a partial cross-sectional view of a TAB package which is subjected to an ILB process by using a bonding machine according to the present invention.

The TAB-ILB process according to the present invention will be explained, with reference to FIG. 2A where the same constructional elements are denoted with the same reference numerals and detailed description thereof will not be given. Referring to the FIG. 2A, between the upper surface of a clamp 4 and inner leads 1 is mechanically connected heat dissipation plate L made of materials having good heat conductivity. As a material of the heat dissipation plate L, copper, copper alloy or alloy 42 (Nickel 42% and Fe 58%) may be used, or copper alloy or alloy 42 coated with diamond by a chemical vapor deposition method can be also used. Alternatively, the heat dissipation plate can be formed of a copper thin foil-clad alloy 42, in order to enhance the heat conductivity of the plate L while keeping the mechanical strength of the alloy 42.

Because the bonding machine 5 is constructed as shown in FIG. 2, the heat emanated from the machine 5 can be drawn out via the heat dissipation plate L which is contacted to the inner leads 1 at approximately the center position A of the inner leads between the region C proximate to the clamp 4 and the region B receiving heat directly from the bonding machine 5. As a result, heat conducted to the inner leads 1 from the bonding machine 5 is seldom transferred to the region C. And heat flux transferred to the leads by radiation or mostly convection is blocked by the plate L. It should be noted at this time that the heat dissipation plate L plays two roles, namely one of intercepting the conduction of heat, and another blocking the heat flux.

Figure 2B:
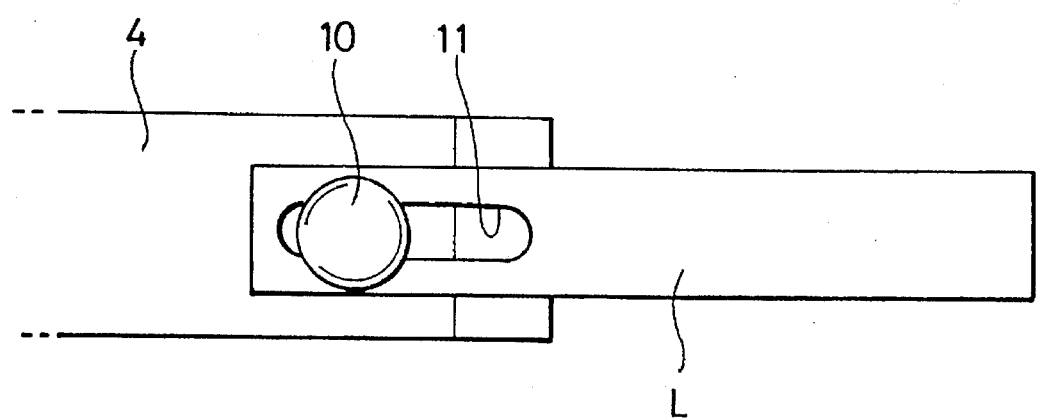
FIG. 2B is a plan view of a heat dissipation plate attached by a screw and a bolt hole to a clamp of the bonding machine according to the present invention.

From the above description, it can be easily understood that the degradation phenomenon, in which the adhesive 2 peels out from the inner leads 1 at the position A can be prevented, as can electrical failure caused by the difference of the coefficients of thermal expansion of the inner leads 1 and the bumps 6, since temperature of the inner leads can be lowered. FIG. 2B is a plan view showing the structure of the heat dissipation plate L fixed to the clamp 4. A nut hole 11 which is shaped as a flat ellipse on the heat dissipation plate L is coupled to the clamp 4 by the fixing means 10. The elliptical nut hole 11 is for positioning of the heat dissipation plate L, and makes it possible for the heat dissipation fin of the present invention to be applied to different kinds of TAB packages without any additional treatments to determine which position of the heat dissipation plate to contact with the inner leads is most appropriate.

Figure 2C:
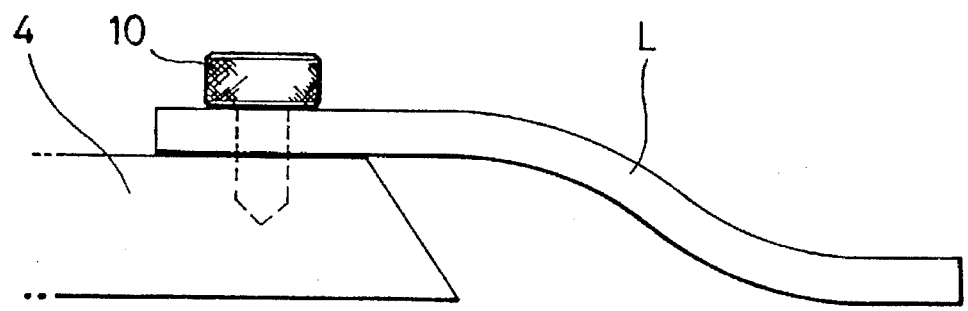
FIG. 2C is a front view of the heat dissipation plate attached by the screw and the bolt hole to the clamp of the bonding machine according to the present invention.

FIG. 2C is a front view of the heat dissipation plate L attached by the fixing means 10 and a bolt hole to the clamp 4 of the bonding machine according to the present invention. The fixing means 10 is, e.g., a screw and serves to mechanically fasten the heat dissipation plate L and the clamp 4.

In order to verify the effect of the heat dissipation plate of the present invention, the inventors have carried out a heat interpretation simulation by a well known Finite Volume Method (FVM). The FVM is suitable to interpret heat dissipation when heat transfers by conduction, convection and radiation are combined, and is evolved from the FDM (Finite Difference Method) obtaining solutions of the heat transfer equations by replacing the differential equations with finite differences.

Figure 4:
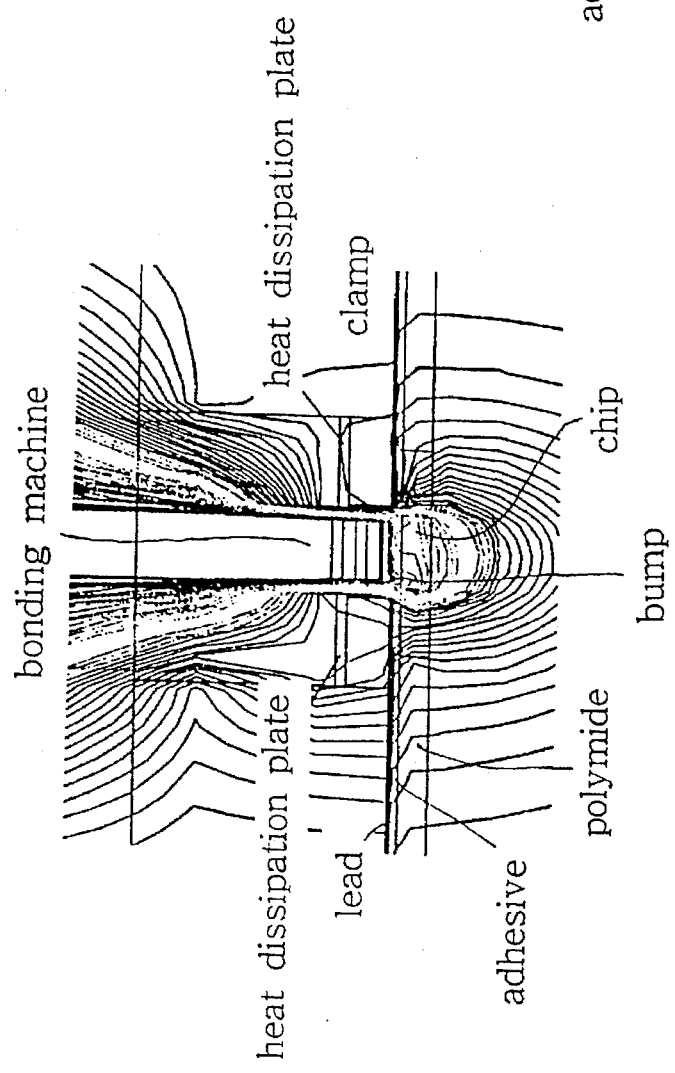
FIG. 4 shows a simulation result for understanding of heat dissipation and heat conduction in plan view when the TAB-ILB process is accomplished with using the conventional ILB machine.

FIG. 4 shows a simulation result of heat dissipation and heat transfer in plan view when the TAB-ILB process is accomplished with the conventional ILB machine. From this Figure, it can be seen that heat of the bonding machine is transferred to the lead and the adhesive.

Figure 3:
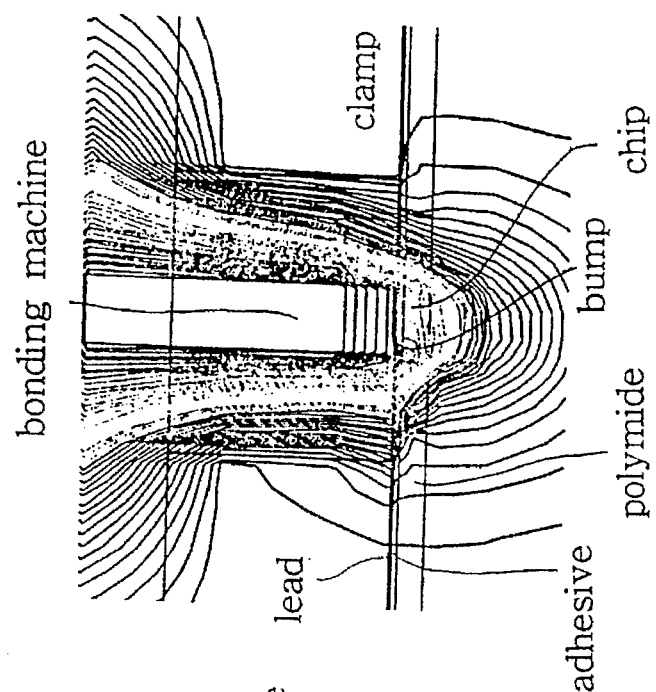
FIG. 3 shows a simulation result for understanding of heat dissipation and heat conduction in plan view when a TAB-ILB process is accomplished using the ILB machine according to the present invention.

FIG. 3 shows a simulation result of heat dissipation and heat transfer in plan view when the TAB-ILB process is accomplished with the ILB machine according to the present invention. Referring to this Figure, the conduction of heat from the bonding machine to the adhesive is intercepted by virtue of the heat blocking action of the heat dissipation plate. In addition to this, the convection of heat from the bonding machine to the leads is also considerably cut off.

Figure 5:
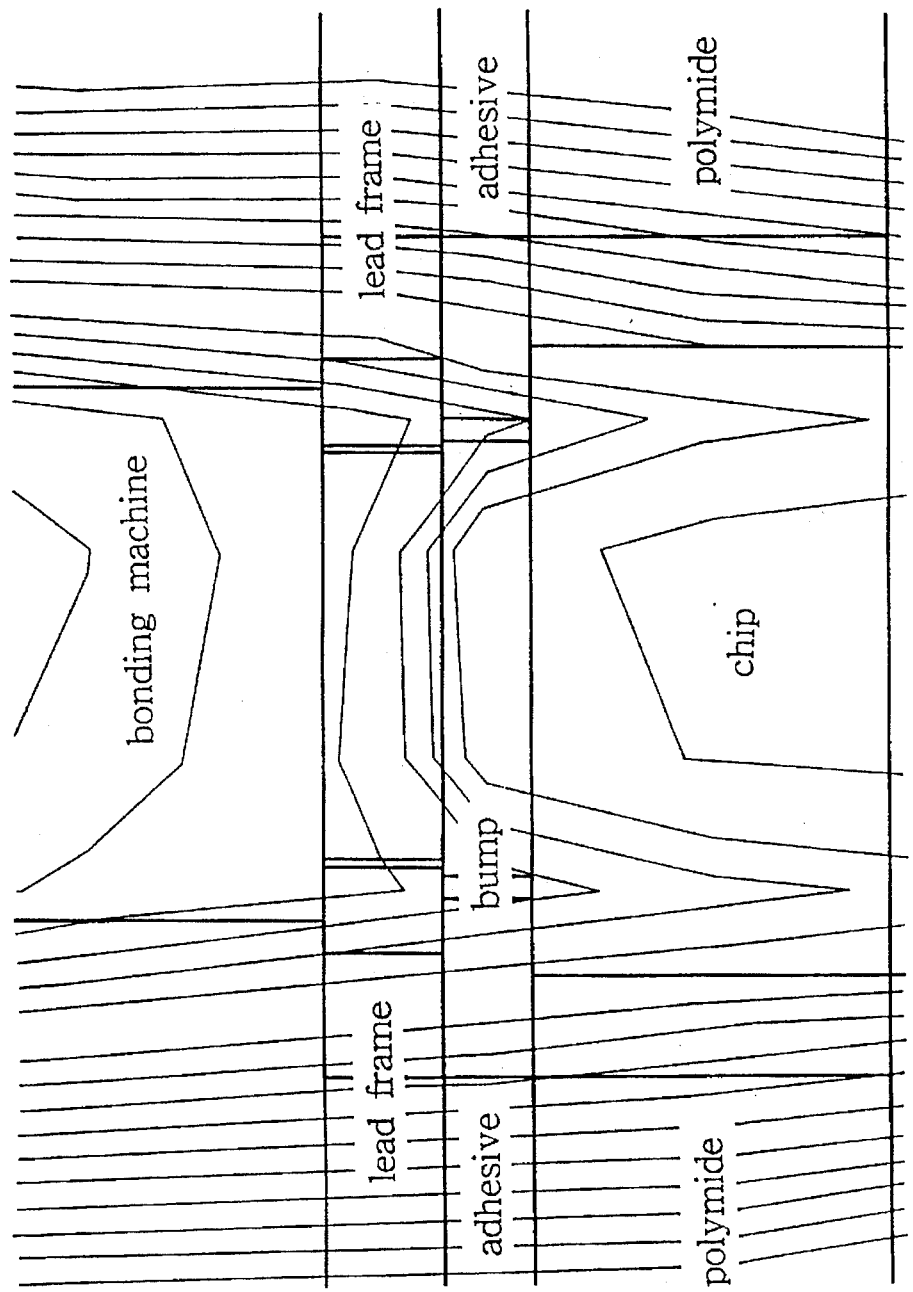
FIG. 5 is an enlarged detail view of a portion around the bumps of FIG. 3.

FIG. 5 is an enlarged detail view of FIG. 3 for more explicitly showing the geographical distribution of heat in the bonding interface region of the lead frame and the bumps of the chip and in the region around the adhesive.

From the simulation results, the temperature around the adhesive is evidently lowered by about 30% by applying the heat dissipation plate to the conventional bonding machine. In conclusion, by applying the heat dissipation means of the present invention to the conventional inner lead bonding machine, the degradation phenomenon of the adhesive can be prevented, and the more elevated temperature and longer dwell time, which are requisites for increasing the number of TAB leads, can be applied to a TAB package in order to guarantee the reliability a multi-lead TAB package. Further, so called chip cratering which may occur in a TAB-ILB process can be reduced due to the fact that the amount of heat transferred from the hot bonding machine to the chip be decreased (i.e., the gradient of temperature from the bonding machine to the chip becomes lower). In other words, a chip is more likely to be damaged and crushed to craters in direct proportion to the temperature gradient, because the hotter the bonding machine the more stress will be built up in the chip.

Although the present invention is described with reference to the accompanying drawings, this is only for explanation and other embodiments can be practiced in still other ways without departing from the spirit or essential character thereof. For instance, even though the description hereinabove is given of a semiconductor chip having bumps on its electrode bonding pads, a bumped leaded TAB having the bumps formed on the inner leads may alternately be applied to the heat dissipation plate of the present invention.

What we claim is:

1. An inner leads bonding apparatus for bonding inner end portions of a plurality of inner leads extending from respective attachments to polymer tape in a predetermined pattern, to bumps formed on electrode bonding pads of a semiconductor chip presented in confronting relation to respective one faces of said inner lead inner end portions, comprising:

a thermo-compression device for providing heat and pressure to the bumps and inner lead inner end portions for effectively connecting respective of the bumps to respective of the inner lead inner end portions;

supports clamping and upholding the inner leads at locations where said inner leads are attached to polymer tape and spaced from contact with said inner end portions of said inner leads;

a plurality of heat dissipators, each having an outer end mounted to respective of said supports on a same side as said thermo-compression device and an inner end extending beyond the respective of the supports for engagement with an intermediate region of a respective inner end portion of a respective inner lead at a location between said thermo-compression device and the respective of said supports for obstructing heat transfer from the thermo-compression device to the polymer tape;

each heat dissipator being a leaf cantilevered from an attachment to the respective of said supports; and each said attachment being an adjustable one provided by an elliptical hole formed through the leaf, and a fastener secured through the hole into the respective of the supports.

2. The inner leads bonding apparatus of claim 1, wherein:

said thermo-compression device is arranged to provide heat for bonding, a temperature in the range of 530° C. to 550° C.

3. The inner leads bonding apparatus of claim 1, wherein:

said heat dissipators are made of a material selected from the group consisting of copper, copper alloy and alloy 42 consisting of 42 percent nickel and 58 percent iron.

4. The inner leads bonding apparatus of claim 1, wherein:

said heat dissipators are made of copper alloy or alloy 42 consisting of 42 percent nickel and 58 percent iron, said copper alloy or alloy 42 being coated with a diamond foil.

5. The inner leads bonding apparatus of claim 1, wherein:

said heat dissipators are made of copper foil clad alloy 42 consisting of 42 percent nickel and 58 percent iron.

6. A method for bonding inner end portions of a plurality of inner leads extending from respective attachments to polymer tape in a predetermined pattern, to bumps formed on electrode bonding pads of a semiconductor chip presented in confronting relation to respective one faces of said inner lead inner end portions, comprising:

(a) providing heat and pressure by a thermo-compression device to the bumps and inner lead inner end portions for effectively connecting respective of the bumps to respective of the inner lead inner end portions;

(b) supporting so as to clamp and uphold the supports clamping and upholding the inner leads at locations where said inner leads are attached to polymer tape and spaced from contact with said inner end portions of said inner leads while conducting step (a); and (c) obstructing heat transfer from the thermo-compression device to the polymer tape while conducting step (a), by engaging each inner end portion of each inner lead at a location between said thermo-compression device and the respective of said supports, on a same side of said inner leads as said thermo-compression device by respective heat dissipators, each having an outer end mounted to respective of said supports and an inner end extending beyond the respective of the supports into engagement with an intermediate region of a respective inner end portion of a respective inner lead at a respective said location.

7. The method of claim 6, wherein:

each heat dissipator is a leaf cantilevered from an attachment to the respective of said supports.

8. The method of claim 7, wherein:

each said attachment is an adjustable one provided by an elliptical hole formed through the leaf, and a fastener secured through the hole into the respective of the supports.

9. The method of claim 7, wherein:

said heat dissipators are made of a material selected from the group consisting of copper, copper alloy and alloy 42 consisting of 42 percent nickel and 58 percent iron.

10. The method of claim 7, wherein:

said heat dissipators are made of copper alloy or alloy 42 consisting of 42 percent nickel and 58 percent iron, said copper alloy or alloy 42 being coated with a diamond foil.

11. The method of claim 7, wherein:

said heat dissipators are made of copper foil clad alloy 42 consisting of 42 percent nickel and 58 percent iron.

12. The method of claim 6, wherein:

said thermo-compression device is arranged to provide heat for bonding, a temperature in the range of 530° C. to 550° C.

* * * * *